United States Patent
Olzak et al.

Patent Number: 6,153,720
Date of Patent: Nov. 28, 2000

[54] DATA AND COCKPIT VOICE RECORDER ENCLOSURE

[75] Inventors: Richard A. Olzak, Kirkland; Gary Kersten, Duval, both of Wash.

[73] Assignee: AlliedSignal Inc., Morristown, N.J.

[21] Appl. No.: 09/054,059

[22] Filed: Apr. 2, 1998

[51] Int. Cl.[7] ................................................. C08G 63/00
[52] U.S. Cl. ............................................................. 528/182
[58] Field of Search ............................................. 524/186

[56] References Cited

U.S. PATENT DOCUMENTS

| | | | |
|---|---|---|---|
| 3,702,592 | 11/1972 | Gamble | 109/29 |
| 4,446,916 | 5/1984 | Hayes | 165/118 |
| 4,574,454 | 3/1986 | Dyson | 29/434 |
| 4,694,119 | 9/1987 | Groenewegen | 174/52 |
| 4,944,401 | 7/1990 | Groenewegen | 206/521 |
| 5,123,538 | 6/1992 | Groenewegen | 206/521 |
| 5,407,505 | 4/1995 | Groenewegen et al. | 156/153 |
| 5,708,565 | 1/1998 | Fairbanks | 361/704 |
| 5,709,914 | 1/1998 | Hayes | 428/35.1 |
| 5,810,919 | 9/1998 | Olzak et al. | 106/207 |

FOREIGN PATENT DOCUMENTS

| | | | |
|---|---|---|---|
| 62-135591 | 6/1987 | Japan | C10L 1/00 |
| 1726490 | 4/1992 | U.S.S.R. | C09K 5/06 |

*Primary Examiner*—Terressa M. Boykin

[57] ABSTRACT

A crash-survivable enclosure (10) for protecting a data memory unit (45) used in vehicles has a shell (15) with an inner surface (22). The shell (15) defines an interior cavity (26) which contains the data memory unit (45). The enclosure (10) has a heat absorption composition (20) which lines a portion of the inner surface (22) and substantially surrounds the data memory unit (45). The composition is capable of exhibiting an endothermic phase transition when subjected to a high temperature environment. The phase transition is typically from a solid phase to a non-solid, flowable phase. The shell can also have a plurality of vents (42). The vents (42) are sized and positioned to permit the heat absorption material (20) to drain from the shell when in the non-solid, flowable phase. The vents (42) can be positioned such that the flowable heat absorption material will drain regardless of the orientation of the shell (15).

23 Claims, 4 Drawing Sheets

DATA AND COCKPIT VOICE RECORDER ENCLOSURE

BACKGROUND OF THE INVENTION

1. Field of the Invention

The present invention relates to crash-survivable enclosures for data memory units used in aircraft and other vehicles operating over land and water. More particularly, the invention is directed toward a crash-survivable enclosure which is capable of withstanding submersion to depths of up to 20,000 feet and high impact, shock, and mechanical penetration forces that commonly occur in a crash and the high temperatures, flames, and heat that often develop after a crash.

2. Description of the Prior Art

Solid state memory devices have been used in data recorders for recording essential data or information useful in determining causes of crashes or other mishaps in aircraft and other vehicles. When a crash occurs, it is essential that the recorded information on board survive the crash and subsequent events including heat, cold, flame, and fire that may afterwards ensue. In the event that the crash occurs over the ocean or other large body of water, the recorded information must be protected from the hydraulic pressure effects of deep water submersion.

Shielding the memory unit of a vehicle data recorder system during a crash, submersion, and/or a fire, for example, presents extremely demanding design constraints. Generally, it is desirable to protect voice and operational data supplied to the memory unit during a predetermined time interval immediately prior to a crash. In this regard, in order to preserve the data, the memory unit must be enclosed in a protective device configured and arranged to withstand temperatures in excess of 1,100° C. (approximately 2,000° F.) experienced during a fire and pressures up to 8,660 psi experienced at ocean depths of up to 20,000 feet. Simultaneously, the enclosure must be constructed to endure crushing and penetration forces experienced either on impact or during secondary impact with other portions or pieces of the vehicle.

Typical enclosures designed to meet these constraints are usually bulky, hemispherical enclosures, which have large space, weight, and power requirements. These extreme requirements generally prohibit the use of most crash-survivable enclosures in small vehicles such as, general aviation aircraft, railroad passenger/cargo cars, buses, or cargo trucks.

In view of these limitations, an enclosure is needed that is crash-survivable with a reduced size, a light weight, and a low power requirement.

SUMMARY OF THE INVENTION

The present invention provides an improved crash-survivable protective enclosure. The enclosure is a structure adapted to meet or better all of the requirements as set forth in FAA TSO-C123a/C124a and in EUROCAE ED-55/56a. Each of these documents sets forth the current requirements for protecting data memory units using solid state memory devices. Although conventional enclosures also meet or exceed these standards, the present invention is improved such that it can be made smaller, with a reduced diameter and weight, relative to other protective enclosure designs. The reduction in size and weight is made possible by using a cylindrical shell for the mechanical strength advantages of the form and its relatively reduced surface area which exposes less of the enclosure to a heat source. The enclosure is also used in combination with materials that posses heat absorption properties far superior to other, currently known heat absorbers. Because of these improvements, the enclosure is well suited for use in general aviation aircraft, in passenger/cargo rail cars, cargo trucks, buses and other similar vehicles. The improved enclosure also helps to reduce total overall installation costs.

In one embodiment of the invention, a crash-survivable enclosure for protecting a data memory unit used in vehicles has a shell with an inner surface. The shell defines an interior cavity which contains the data memory unit. The enclosure also has a heat absorption composition which lines a portion of the inner surface and substantially surrounds the data memory unit. The composition is capable of exhibiting an endothermic phase transition when subjected to a high temperature environment. The phase transition is typically from a solid phase to a non-solid, flowable phase, which typically includes liquid and/or gas phases. The shell can also have a plurality of vents. The vents are sized and positioned to permit the heat absorption material to flow from the shell when in the non-solid phase. The vents can be positioned such that the heat absorption material will drain regardless of the orientation of the shell. In yet another embodiment, the vents comprise a plurality of substantially small holes arranged on the periphery of a back portion of the shell at predetermined intervals.

In another embodiment of the invention, the crash-survivable enclosure for protecting a data memory unit used in vehicles has a continuously formed cylindrical shell having circular first and second plain, open ends, and an inner surface. The shell provides an interior cavity for the data memory unit. End covers are also provided for covering the first and second open ends. The endplates are preferably positioned or mounted to provide a shell which is substantially free of material extending axially beyond the plain ends of the shell or radially beyond the outer circumferential surface of the shell. Advantageously, the end cover covering the first open end is a removable access panel which can be mounted to a seal ring recessed within the cylindrical enclosure. The heat absorption composition lines a portion of the inner surface and a portion of the access panel and surrounds the data memory unit.

Another aspect of the invention relates to a process for protecting a data memory unit used in a crash-survivable enclosure for vehicles. The steps of the process include housing a data memory unit in a continuous form shell, the shell defining a cavity having an inner surface. Heat entering the shell is absorbed by the endothermic phase change of a heat absorption composition which lines a portion of the inner surface and surrounds the data memory unit. The phase transition is from a solid phase to a non-solid, flowable phase. The flowable heat absorption material automatically flows out of the shell through a plurality of vents. The vents are sized and positioned to permit the flowable heat absorption material to automatically flow out of the shell regardless of the orientation of the shell.

Other features and advantages of the invention will appear from the following description in which the preferred embodiment has been set forth in conjunction with the accompanying drawings.

DESCRIPTION OF THE PREFERRED EMBODIMENT

Figure 1:
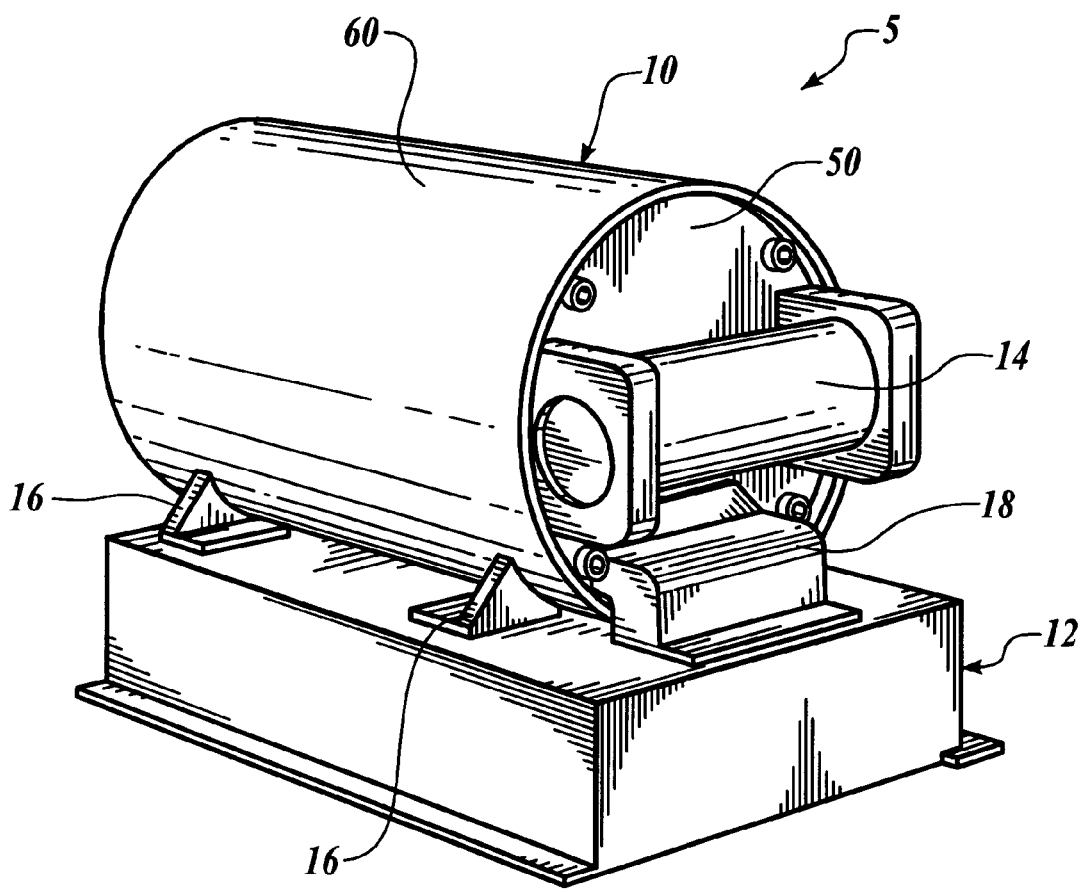
FIG. 1 is a perspective view of a data recorder assembly which includes a crash-survivable enclosure according to the present invention.

Referring to FIG. 1, a data recorder assembly 5, according to the present invention, is shown and includes a data memory unit enclosure 10 mounted to a universal carrier housing 12 by foot mounts 16 with an underwater locating beacon 14 mounted adjacent to a recessed access panel 50 of enclosure 10. Carrier housing 12 is adaptable to fit into a vehicle of choice.

Assembly 5 also includes a flex cover 18 which provides a pathway from internal cavity 26 of the enclosure through universal carrier 12 for power supply leads and data transmission lines. A conventional underwater locating beacon (ULB) 14 is mounted on an outer surface of enclosure 10 to give ready access for battery check and/or replacement.

The incident (e.g. crash) site often contains debris. Moreover, it may also be underwater. To aid in locating the protective portion of the system, enclosure 10 is finished in a durable, abrasion protective, brightly colored material, such as bright orange, that enhances identification at an incident site.

Access to the internal portion of data memory unit enclosure 10 for data retrieval after an accident is assured by way of a uniquely retained, removable access panel 50 (described below), which is removable by virtue of a floating mounting system 60 that reduces the shear forces on the critical retention hardware. Floating mounting system 60 is described below in more detail.

Figure 2:
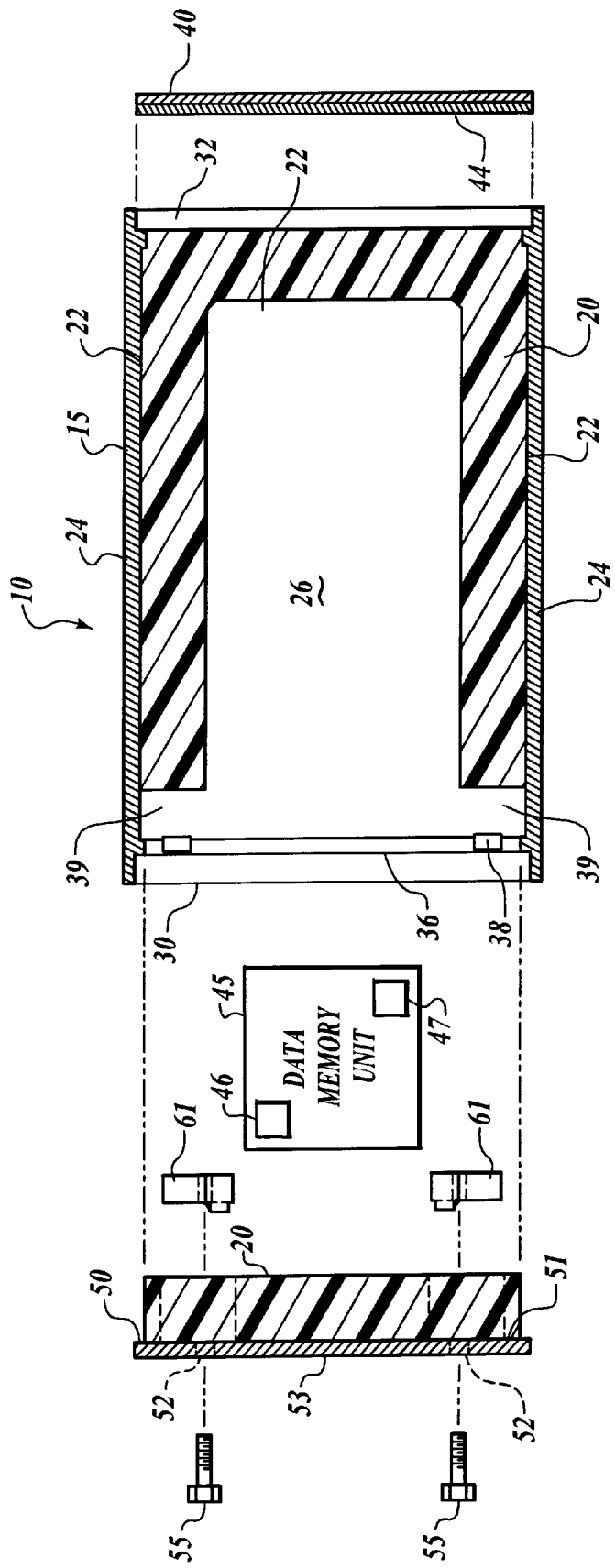
FIG. 2 is an exploded cross-sectional view of the crash-survivable enclosure of FIG. 1.

Generally, thermally protected data memory unit enclosure 10, as represented in FIG. 2, includes a shell 15 having an inner surface 22, outer surface 24, and first and second plain, open ends 30, 32. First open end 30 is enclosed by access panel 50. Second open end 32 is enclosed by end cover 40.

Enclosure 10 can be configured in any suitable shape, and is preferably generally cylindrical in shape as shown in FIG. 1. Protective, crash-survivable data memory unit enclosure 10 uses the natural strength advantage of a continuous cylindrical form to obtain the maximum resistance to penetration and crushing using a minimum amount of hardened material, thereby conserving the weight needed to provide the impact/penetration resistance required to survive a crash or other vehicle disaster. Shell 15 of enclosure 10 is typically constructed of a metal, preferably, hardened stainless steel or titanium, that has a high resistance to crushing and piercing, but also exhibits a high thermal conductivity. Another advantage of using cylindrical shaped shell 15 is that it provides relatively less surface area exposure to heat and/or flames that may be present in a crash. An intumescent coating or paint is generally applied to the exterior surfaces of the shell for additional thermal protection. The combination of a high strength advantage and a low surface area exposure to heat environments, permits enclosure 10, protecting data memory unit 45, to be made smaller than conventional enclosures, without sacrificing heat protection for the data memory unit contained therein.

Enclosure 10 is also free of material extending radially beyond outer circumferential surface 24 of shell 15 and axially beyond plain open ends 30, 32 of shell 15. FIG. 2 also shows a heat absorption material 20, which lines each interior surface 22 of shell 15 to form an interior, cup shaped, cavity 26 centrally located within shell 15, cavity 26 housing a data memory unit 45. Access panel 50 also has a portion of its inner surface 51 covered with heat absorption material 20.

Heat absorption composition 20 provides the heat shielding necessary to protect data memory unit 45 from a high temperature environment. In a fire or other high temperature environment, heat absorption composition 20 acts as a heat shield initially, by exhibiting a relatively high thermal inertia. When composition 20 reaches the phase transition point, it acts as a heat sink by utilizing the heat energy needed to convert the composition from the solid phase to the liquid phase in an endothermic transition. The use of the heat energy to produce this phase transition maintains the maximum temperature environment at an acceptable level.

In addition to its utility as a heat absorbing materials, composition 20 is also useful in enclosure 10 as a shock absorbing material. For example, enclosure 10 may be subjected to intense shock in the area of 3400 Gs on impact during crash conditions. Under such physical impact force, the composition absorbs a portion of the shock by deforming only enough to divert the impact shock wave away from the memory device, but not enough to penetrate any surrounding insulation creating voids that might become heat flux paths to data memory unit 45. The density of the composition is naturally appropriate for this application.

In one particular embodiment, the composition is an amide-type synthetic organic wax, which is commercially available in the industry for a variety of uses unrelated to heat absorption. Composition 20 includes between about 35 percent and about 45 percent by weight of a first amide wax, an N,N'-ethylenebisstearamide (also known as N,N'-distearoylethylenediamine) wax, having a melting point of between 232° C. and 240° C. One example of this wax is commercially available from Lonza, Industries of Fair Lawn, N.J. under the trade ACRAWAX HMS®. The composition also includes between about 65 percent and about 55 percent by weight of a second amide wax, N,N'-ethylenebisstearamide, having the empirical formula $H_{33}C_{17}COHNC_2H_4NHCOC_{17}H_{35}$, and a melting point of about 120° C. One example of this wax is commercially available from Lonza, Industries of Fair Lawn, N.J. under the tradename ACRAWAX C®. In a preferred embodiment, the composition includes 40 percent by weight of the first wax component having a melting point of between 232° C. and 240° C. and about 60 percent by weight of the second wax component having a melting point of 120° C.

In yet another embodiment, heat absorption composition 20 is a polyoxymethylene polymer composition. In the event of a crash, the data memory unit may be subjected to temperatures in the range of 1,100° C. for up to an hour. The polymer undergoes endothermic decomposition when the enclosure is subjected to high heat.

Polymers having the suitable general characteristics are commercially available in the art and may be known as "paraformaldehyde". Another polymer having the foregoing general characteristics is commercially available under the tradename DELRIN® from DuPont. Those skilled in the polymer art may readily identify other suitable commercially available polymers having the foregoing general characteristics by reference to any of several chemical reagent supplier catalogues.

In yet another embodiment, heat absorption composition 20 employed in the present invention, includes a bicarbonate compound and a binder. Suitable bicarbonate compounds will be readily apparent to those skilled in the art. Specific examples of suitable bicarbonate compounds include but are not limited to sodium bicarbonate, potassium bicarbonate and ammonium bicarbonate. Sodium bicarbonate is currently preferred because of its ready availability and low cost and may be used without the addition of a binder. Preferably, the bicarbonate compound and binder will be formulated having between about 10 percent and about 99 percent by weight of a bicarbonate compound and between about 90 percent and 1 percent by weight of a binder.

A complete and thorough description of the heat absorption compositions described above are found in commonly assigned and currently pending U.S. patent application Ser. Nos. 08/963,879, filed Nov. 4, 1991, Attorney Docket No. 543-97-004), U.S. Pat. No. 5,810,919 filed Nov. 4, 1997, (Attorney Docket No. 543-97-007), and 08/963,948, filed Nov. 4, 1997, (Attorney Docket No. 543-97-005), the full disclosures of which are incorporated herein by reference.

The compositions described above provide a number of advantages. The components of the compositions are relatively easy to handle, relatively low in cost, formable, and more effective at heat absorption as compared to conventional heat absorption materials. Because the composition absorbs heat more efficiently than conventional heat absorption agents, enclosure 10, protecting data memory unit 45, which includes composition 20 of the present invention, can be made smaller than conventional enclosures, without sacrificing heat absorption protection for the data memory unit contained therein.

In a preferred embodiment of the invention, data memory unit 45 is a solid state electronic memory device, which includes a data memory board 46 and a controller board 47, for storing data which is to be recovered from the device following exposure of the enclosure to a crash and/or a high temperature environment. An example of such a device includes a semiconductor, electronically erasable, programmable, read-only, memory circuit. A data acquisition unit periodically supplies digital signals which are sequentially written into semiconductor memory circuit so that the memory circuit stores a sequence of digital words that is a time sampled data representation of the history for each parameter being monitored. Typically, with respect to currently employed techniques, data compression is generally employed to allow storing of digital signals representative of a 15–30 minute time history for each monitored parameter.

Figure 3:
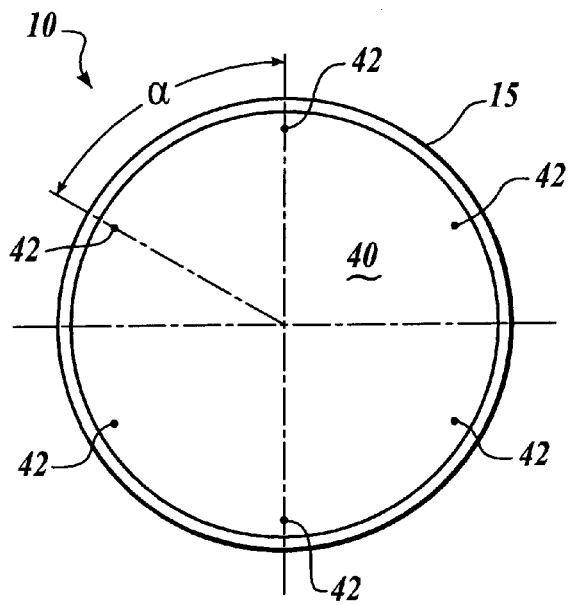
FIG. 3 is an elevation view of the crash-survivable enclosure of FIG. 1, showing an end cover according to an embodiment of the present invention.
Figure 4:
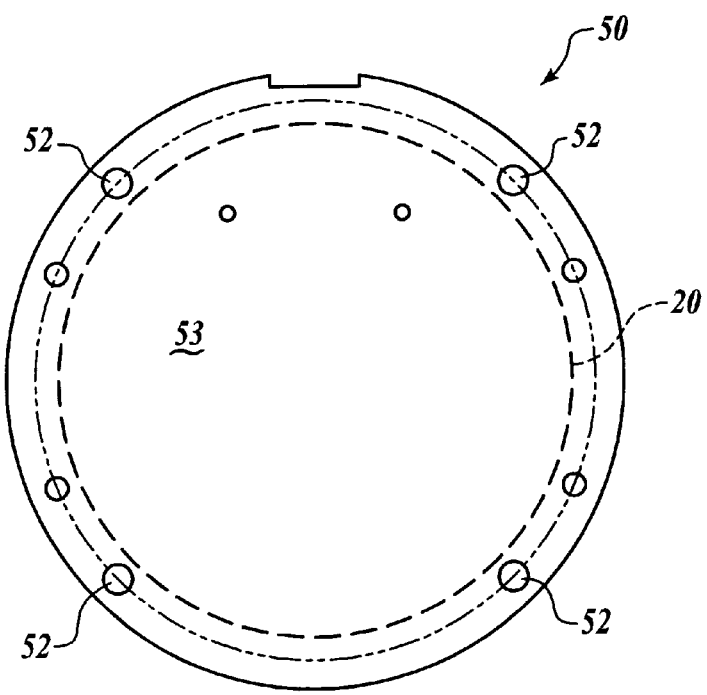
FIG. 4 is a front view of the access panel of FIG. 1.
Figure 5A:
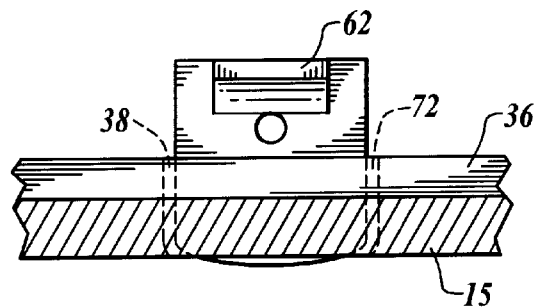
FIGS. 5A–5C are simplified illustrations of the latch hold down device of FIG. 1.
Figure 5B:
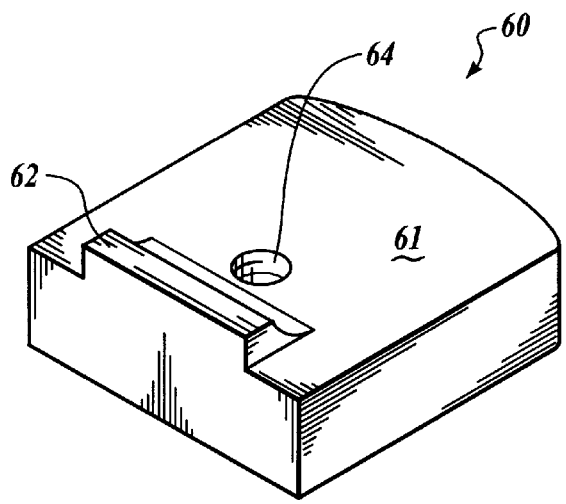
Figure 5C:
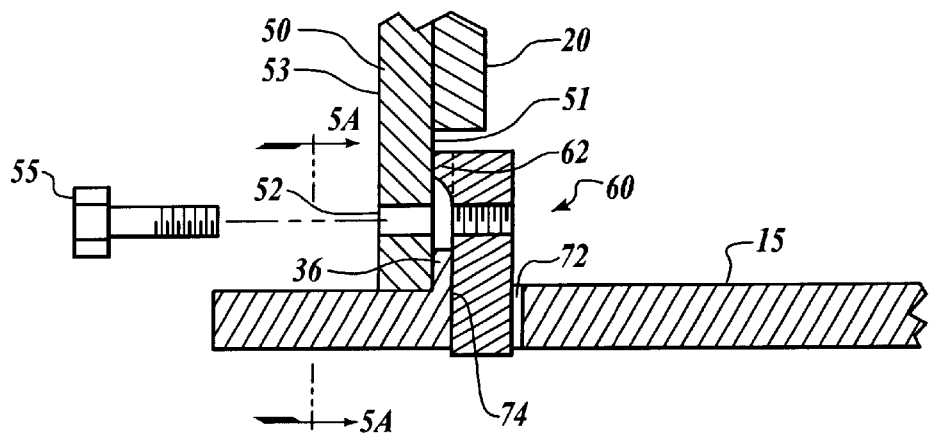

Referring to FIGS. 2 and 3, shell 15 of enclosure 10 includes a plurality of vents 42 which provide communication between the outer environment and inner cavity 26. Vents 42 are sized and positioned to permit heat absorption material 20 to flow from shell 15 when in the non-solid, flowable phase. In the event that enclosure 10 becomes submerged, vents 42 provide for the equalizing of pressure between the outer submerged environment and inner cavity 26. Enclosure 10 may be submerged up to depths of 20,000 feet and subjected to pressures up to 8,660 psi in a crash occurring, for example, over the ocean. At such depths, the equalization of pressure prevents crushing of shell 15 and subsequent damage to data memory unit 45.

In a preferred embodiment, vents 42 are a plurality of substantially small holes arranged, for example, on the periphery of a back cover 40 or front cover 50, at predetermined intervals. The intervals are configured on shell 15 to provide omni-directional venting, such that a liquid composition can be drained from shell 15, regardless of the orientation of the tube. Vents 42 also provide suitable omni-directional venting for pressure equalization for a submerged enclosure, as well.

In an alternative embodiment, the holes may be capped. The caps can take many forms, which include, for example, a material that burns away or is dissolved by the liquid composition or exposure to sea water. The caps can also be spring loaded covers that are retained by heat, shock, and depth sensitive devices which release the covers upon impact, exposure to heat, or deep submersion in water.

The liquid phase composition expulsion or the pressure equalization can simultaneously occur, when necessary, through slots 38 located on the side-wall of enclosure 10. Slots 38, as described below, are non-precision, since the manufacturing tolerance of slots 38 are preferably made relatively liberal, thereby allowing expulsion of the flowable phase composition material and pressure equalization to occur as needed.

Referring now to FIGS. 4 and 5A–C, access panel 50 is shown which is mounted onto enclosure 10 and provides access to memory unit 45 for data retrieval. In ordinary crash-survivable enclosures, an access panel is typically bolted down on to the main body of an enclosure requiring a flange or similar mounting surface. The flange usually extends out beyond the perimeter of the enclosure and does not allow for venting. Panel 50 is penetration and fire-proof, and removable by virtue of a floating mounting system 60 that reduces the shear forces on the critical retention hardware. Mounting system 60 includes high strength latch device 61 developed for the specific purpose of ensuring the retention of removable access panel 50 in a situation when the unit is subjected to 3,400 Gs of impact force. To accommodate the normal tolerance variations of manufacturer, latch 61 is designed to use an integrated fulcrum 62 that acts as a floating member, impinging on inside surface 51 of access panel 50. Since cylinder 10 is a pressure-resistant shape, latch 61 depends on side-wall 74 to maintain its bearing surface opposite fulcrum 62. In the initial application of latch device 61, four non-precision slots 38 are located at predetermined intervals, preferably at 90° around the crash resistant cylinder 10. Slots 38 are sized liberally to receive a portion of latch device 61. Occurring at four locations around the cylinder, a redundancy of engagement ensures access panel retention, even if 50 percent of latches 61 are destroyed in the crash. The latch material is non-corrosive with adequate radii to prevent stress cracking over time.

A conventional, high strength fastener 55 passes through access panel 50 from outside surface 53 and engages a threaded hole 64 in each latch device 61. Latch 61 engages fastener 55 in a floating situation, which ensures the parallelism of the latch to the access panel and ensures that fastener 55 is retained in a perpendicular attitude before any tightening forces are applied. Moreover, fastener 55 penetrates latch body 61 completely before fulcrum 62 is engaged, ensuring a smooth installation of components, free of any binding. To seal access panel 50 against seal ring 36 of crash resistant enclosure 10, fastener 55 is tightened in a conventional manner with fulcrum 62 inboard of latch 61, bearing on the underside of access panel 51, while the outboard section of the latch engages sidewall 74 of the cylinder.

While the latch device has particular adaptability in a cylindrical shell, which presents extra tolerance and design challenges, it is just as serviceable in a straight-walled application. The advantage of allowing the latch body to float in (i.e. not fastened) slots 38 is that it permits fastener holes 52 on access panel 50 and seal ring 36 to be produced with generous manufacturing tolerances. The generous tolerances produce gaps 72 and facilitate easy assembly, while reducing production costs. Because of fulcrum 62, slots 38 in the shell sidewall can also be non-precision; this tolerance being accommodated by tightening the through-hole fastener which draws the latch body toward the access panel engaging first fulcrum 62 then shell side-wall 74 by way of slot 38. Once panel 50 is secure against ring 36 with the latch bearing simultaneously on panel 50 and shell wall 74, tightening fastener 55 puts extra strength latch body 61 in bending, which ensures fastener retention during shock and vibration. The invention is equally able to retain access panel 50 whether the tension forces or the shear forces are generated externally by impact or internally by shock.

Although the essential elements of the enclosure of the present invention have been described in great detail, one skilled in the art can envision a number of modifications to the enclosure which are based upon conventional technology in the art of crash-survivable enclosures, and are therefore contemplated by the instant invention. For example, it may be desirable to include as another component of enclosure 10, a thermal insulating layer 44 between composition 20 and interior surface 22 of interior cavity 26. Suitable thermal insulating liners will be readily determinable by those skilled in the art and can include a shell-like thermal liner positioned within the interior cavity adjacent to the interior surfaces of the interior cavity, which conforms to the geometric shape of the interior cavity.

What is claimed is:

1. A crash-survivable enclosure for protecting a data memory unit used in vehicles comprising:
   a shell, having an inner surface and an outer surface, defining an interior cavity for containing a data memory unit; and
   a heat absorption composition which lines a given portion of the inner surface, such said that heat absorption composition surrounds the data memory unit;
   the composition exhibiting an endothermic phase transition when subjected to a high temperature environment, the phase transition being from a solid phase to a non-solid, flowable phase;
   the shell comprising a plurality of vents, the vents sized and positioned to permit heat absorption material to drain from the shell when in the non-solid, flowable phase regardless of the orientation of the shell.

2. The enclosure of claim 1, wherein the shell comprises a right circular cylindrical tube.

3. The enclosure of claim 2, wherein the shell comprises an access panel having an inner surface coupled to an inner portion of the cylindrical tube using a high strength retaining mechanism.

4. The enclosure of claim 1, wherein the heat absorption composition comprises:
   a) between about 35 percent and 45 by weight of an N', N'-ethylenebisstearamide wax having a melting point of between 232° C. and 240° C.; and
   b) between about 65 percent and about 55 percent by weight of N', N'-ethylenebisstearamide wax having a melting point of 120° C.

5. The enclosure of claim 1, wherein the heat absorption composition comprises a polyoxymethylene polymer.

6. The enclosure of claim 1, wherein the heat absorption composition comprises:
   a) between about 10 percent and about 99 percent by weight of a bicarbonate compound; and
   b) between about 90 percent and 1 percent by weight of a binder.

7. The enclosure of claim 1, wherein the shell has a back portion with a periphery and the vents comprise a plurality of holes arranged through the periphery of the back portion of the shell at predetermined intervals.

8. The enclosure of claim 1, further comprising an insulating liner between the composition and the inner surface of the shell.

9. A crash-survivable enclosure for protecting a data memory unit used in vehicles comprising:
   a shell, having an inner surface and an outer surface, defining an interior cavity for containing a data memory unit; and
   a heat absorption composition which lines a given portion of the inner surface such that said heat absorption composition surrounds the data memory unit;
   the shell comprising a plurality of vents, the vents sized and positioned to provide for pressure equalization between the inner cavity and an outside environment.

10. A data recorder assembly comprising:
    a crash-survivable enclosure comprising:
       a shell, having an inner surface and an outer surface, defining an interior cavity for containing a data memory unit; and
       a heat absorption composition which lines a given portion of the inner surface such that said heat absorption composition surrounds the data memory unit;
       the composition exhibiting an endothermic phase transition when subjected to a high temperature environment, the phase transition being from a solid phase to a non-solid, flowable phase; and
       the shell comprising a plurality of vents, the events sized and positioned to permit heat absorption material to drain from the shell when in the non-solid, flowable phase regardless of the orientation of the shell; and
    a data memory unit comprising:
       a controller board for digitizing data including operating parameter data and audio inputs; and
       a solid state electronic memory bank for storing the digitized data, the data to be recovered from the memory bank following exposure of the enclosure to a high temperature environment.

11. The assembly of claim 10, further comprising a low voltage power source of between 12 and 28 volts.

12. The assembly of claim 10, further comprising an underwater locating beacon (ULB).

13. The assembly of claim 10, further comprising a universal carrier readily adaptable to a plurality of vehicles.

14. A crash-survivable enclosure for protecting a data memory unit used in vehicles comprising:
    a continuously formed cylindrical shell having plain circular, first and second open ends, and an inner and outer surface, the shell providing an interior cavity for a data memory unit;
    endcovers covering the first and second open ends positioned to provide a shell substantially free of material extending beyond the plain, circular ends of the shell; and
    a heat absorption composition which lines a given portion of the inner surface such that said heat absorption composition surrounds the data memory unit, the composition exhibiting an endothermic phase transition when subjected to a high temperature environment, the phase transition being from a solid phase to a non-solid, flowable phase.

15. The enclosure of claim 14, further comprising a plurality of vents, the vents sized and positioned on the shell to permit the heat absorption material to drain from the shell when in the non-solid, flowable phase regardless of the orientation of the shell.

16. The enclosure of claim 15, wherein the second endcover has a periphery and the vents comprise a plurality of substantially small holes arranged through the periphery of the endcover at predetermined intervals.

17. The enclosure of claim 14, wherein the first endcover is a removable access panel recessed within the cylinder.

18. The enclosure of claim 14, wherein the heat absorption composition comprises:
   a) between about 35 percent and 45 by weight of an N', N'-ethylenebisstearamide wax having a melting point of between 232° C. and 240° C.; and
   b) between about 65 percent and about 55 percent by weight of N', N'-ethylenebisstearamide wax having a melting point of 120° C.

19. The enclosure of claim 14, further comprising a plurality of vents, the vents sized and positioned on the shell to provide for pressure equalization between the inner cavity and an outside environment.

20. A process for protecting a data memory unit used in vehicles in a crash-survivable enclosure, the steps of the process comprising:
   housing a data memory unit in a continuous form shell, the shell having an inner surface defining a cavity;
   absorbing heat which passes through the shell by the endothermic phase transition of a heat absorption composition said heat absorption composition lining a portion of the inner surface such that said heat absorption composition surrounds the data memory unit, is the phase transition being from a solid phase to a non-solid, flowable phase; and;
   permitting the heat absorption material to flow from the shell when in the non-solid, flowable phase using a plurality of vents formed through the shell, the vents sized and positioned to permit the flowable heat absorption material to drain regardless of the orientation of the shell.

21. The process of claim 20, further comprising the step of selecting a heat absorption composition comprising:
   a) between about 35 percent and 45 by weight of an N', N'-ethylenebisstearamide wax having a melting point of between 232° C. and 240° C.; and
   b) between about 65 percent and about 55 percent by weight of N', N'-ethylenebisstearamide wax having a melting point of 120° C.

22. The process of claim 20, wherein the flow permitting step is carried out with the vents comprising a plurality of holes positioned around the shell.

23. A process for protecting a data memory unit used in vehicles in a crash-survivable enclosure, the steps of the process comprising:
   housing a data memory unit in a continuous form shell, the shell having an inner surface defining a cavity; and
   permitting pressure equalization between the cavity and an outside environment using a plurality of vents formed through the shell.

* * * * *